United States Patent
Chen et al.

(10) Patent No.: US 9,018,673 B2
(45) Date of Patent: Apr. 28, 2015

(54) ZENER DIODE DEVICE AND FABRICATION

(75) Inventors: Weize Chen, Phoenix, AZ (US); Xin Lin, Phoenix, AZ (US); Patrice M. Parris, Phoenix, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 167 days.

(21) Appl. No.: 13/601,831

(22) Filed: Aug. 31, 2012

(65) Prior Publication Data

US 2014/0061715 A1    Mar. 6, 2014

(51) Int. Cl.
H01L 29/66    (2006.01)
H01L 29/866    (2006.01)
H01L 29/06    (2006.01)

(52) U.S. Cl.
CPC .......... *H01L 29/866* (2013.01); *H01L 29/0692* (2013.01)

(58) Field of Classification Search
CPC ....... H01L 29/866; H01L 29/06; H01L 29/68; H01L 29/861
USPC .................. 257/106, 655, E29.169, E21.353; 438/380
See application file for complete search history.

(56) References Cited

U.S. PATENT DOCUMENTS

| | | |
|---|---|---|
| 4,079,402 A | 3/1978 | Dunkley et al. |
| 4,441,114 A | 4/1984 | Muggli |
| 4,672,403 A | 6/1987 | Jennings |
| 4,758,537 A | 7/1988 | Jennings |
| 5,276,350 A | 1/1994 | Merrill et al. |
| 5,602,404 A | 2/1997 | Chen et al. |
| 6,605,859 B1 | 8/2003 | Romas, Jr. et al. |
| 6,706,606 B2 | 3/2004 | Romas, Jr. et al. |
| 6,933,546 B2 | 8/2005 | Khemka et al. |
| 7,164,566 B2 | 1/2007 | Xu et al. |
| 7,309,638 B2 | 12/2007 | Khemka et al. |
| 7,701,012 B2 | 4/2010 | Xu et al. |
| 7,911,750 B2 | 3/2011 | Zhan et al. |
| 8,198,703 B2 | 6/2012 | Lin et al. |
| 8,492,866 B1 | 7/2013 | Anderson et al. |
| 2006/0014342 A1 | 1/2006 | Khemka et al. |
| 2006/0208340 A1 | 9/2006 | Glenn et al. |
| 2008/0203534 A1* | 8/2008 | Xu et al. .................... 257/577 |
| 2009/0213506 A1 | 8/2009 | Zhan et al. |

(Continued)

OTHER PUBLICATIONS

USPTO, Office Action for U.S. Appl. No. 14/098,194, mailed Dec. 18, 2014.

(Continued)

*Primary Examiner* — Shaun Campbell
(74) *Attorney, Agent, or Firm* — Ingrassia Fisher & Lorenz, P.C.

(57) ABSTRACT

A disclosed Zener diode includes, in one embodiment, an anode region and a cathode region that form a shallow subsurface latitudinal Zener junction. The Zener diode may further include an anode contact region interconnecting the anode region with a contact located away from the Zener junction region and a silicide blocking structure overlying the anode region. The Zener diode may also include one or more shallow, sub-surface longitudinal p-n junctions at the junctions between lateral edges of the cathode region and the adjacent region. The adjacent region may be a heavily doped region such as the anode contact region. In other embodiments, the Zener diode may include a breakdown voltage boost region comprising a more lightly doped region located between the cathode region and the anode contact region.

17 Claims, 2 Drawing Sheets

(56) References Cited

U.S. PATENT DOCUMENTS

2009/0278168 A1* 11/2009 Hwang et al. ............... 257/173
2010/0244088 A1 9/2010 Whitfield et al.
2011/0175199 A1 7/2011 Lin et al.
2012/0211747 A1* 8/2012 Stribley et al. ............... 257/49

OTHER PUBLICATIONS

U.S. Appl. No. 14/098,194, filed Dec. 5, 2013.

* cited by examiner

ZENER DIODE DEVICE AND FABRICATION

BACKGROUND

1. Field

The disclosed subject matter is in the field of semiconductor devices and, more particularly, semiconductor Zener diodes.

2. Related Art

A Zener diode functions substantially the same as a conventional diode in forward bias, but has a lower reverse bias breakdown voltage and exhibits a controlled reverse bias current enabling the Zener diode to operate in reverse bias breakdown without substantial or permanent damage. Zener diodes typically include heavily doped p-n junctions that result in a thin reverse bias depletion region. Any substantial difference in electric potential applied across this depletion region produces an electric field having a magnitude that is sufficiently large to induce tunneling of electrons from the valence band of the p-type material to the conduction band of the n-type material.

BRIEF DESCRIPTION OF THE DRAWINGS

The present invention is illustrated by way of example and is not limited by the accompanying figures, in which like references indicate similar elements. Elements in the figures are illustrated with an emphasis on clarity and simplicity where possible and have not necessarily been drawn to scale.

DETAILED DESCRIPTION

Figure 1:
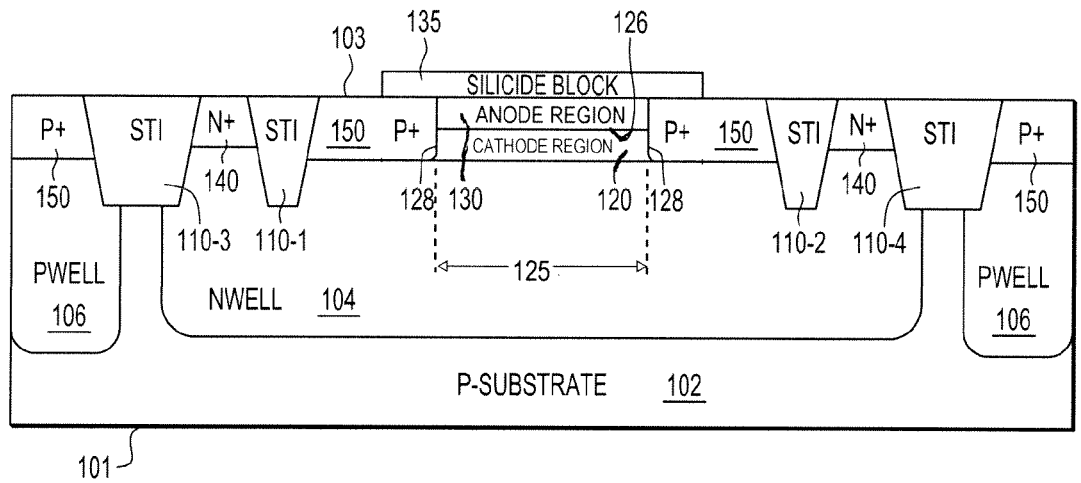
FIG. 1 is a cross section depicting selected elements of an embodiment of a Zener diode.

Integrating a stable and reliable Zener diode having low breakdown voltage and low sub-breakdown leakage current into a fabrication process primarily designed for CMOS logic without adding a significant number of processing steps is desirable, but challenging. Laterally oriented Zener diodes, i.e., diodes in which the anode and cathode are laterally displaced with respect to one another, frequently exhibit large operational variations and higher leakage currents due to photo misalignment, interface states, trapped oxide charges, and instability upon electrical stress. Moreover, while vertically oriented Zener diodes have been proposed and demonstrated, conventional vertical Zener diodes typically require additional process steps.

Subject matter disclosed herein produces Zener diodes that exhibit low leakage and a low breakdown voltage with a bare minimum of additional processing steps. Zener diodes disclosed herein include Zener junction regions in which a shallow anode region overlies a thin cathode region to form a shallow, sub-surface Zener junction having a latitudinal orientation. As used herein, a Zener junction refers to a p-n junction exhibiting a depletion region width of less than approximately 0.1 μm and "latitudinal" refers to an orientation parallel to an upper surface of the wafer. A junction having a latitudinal orientation may sometimes also be referred to as a vertical junction in reference to the direction of current flow, which is generally perpendicular to the orientation of the junction.

In addition to the latitudinal Zener junction, lateral ends of the diode's cathode regions may form shallow, longitudinal sub-surface p-n junctions with anode contact regions. Thus, disclosed Zener diodes may include multiple shallow, sub-surface Zener junctions, some of which may be latitudinal and some of which may be longitudinal.

To protect the shallow p-n junctions in the Zener junction region, disclosed embodiments may include a silicide blocking structure overlying the Zener junction regions to prevent shorting of the shallow junctions during silicide processing steps. Moreover, because the doping and depth of the anode region may be insufficient to support the formation of Ohmic contacts, disclosed Zener diodes may locate its anode contacts exterior to the Zener junction regions and employ heavily doped anode contact regions to interconnect the contacts and the anode region.

In some embodiments, a disclosed Zener diode leverage implant and masking steps of a conventional logic process to form most or all of the diode's structures. For example, in some embodiments, an anode region of the diode is formed during an implant that also forms a lightly doped drain (LDD) of a logic transistor. Similarly, the cathode region may be formed by a halo implant, also sometimes referred to as a pocket implant, an anode contact region may be formed by a p+ source/drain implant, and a cathode contact region may be formed by an n+ source/drain implants. Depending upon the logic process involved, other process steps that might be leveraged for use in fabricating disclosed Zener diodes include, as examples, threshold adjustment implants, extension implants for logic or I/O devices, counter doping implants, and resistor implants. By fabricating all or most of the Zener diode with existing process steps, disclosed Zener diodes are implemented without substantially increasing the cost or complexity of the process.

In one aspect, a disclosed Zener diode includes an anode region extending from an upper surface of a substrate to a first depth. The anode region has a first conductivity type, e.g., p-type, and a first doping concentration. A cathode region of a second conductivity type, e.g., n-type, underlies the anode region, extends to a second depth, and has a second doping concentration. The p-n junction between the anode region and the cathode region comprises a shallow sub-surface latitudinal Zener junction. The diode further includes an anode contact region, e.g., p-type, adjacent to the anode region and extending from the upper surface to a third depth. The anode contact region has a third doping concentration, which may be greater than the first doping concentration. A cathode contact region of the second conductivity type extends from the upper surface to a fourth depth and has a fourth doping concentration, which is greater than the second doping concentration. The cathode contact region may provide an Ohmic contact to the well structure to enable biasing of the well and the cathode region.

A depth of the latitudinal Zener junction may be in the range of approximately 50 to 250 nm. The diode may further include a silicide blocking structure overlying the shallow Zener junction. The silicide block structure prevents shorting the anode region to the cathode region by preventing silicide from forming with a suitable material deposited on the wafer. The silicide blocking structure may be silicon dioxide, silicon nitride, a silicon-oxygen-nitride compound, another type of dielectric material, or a conductive or semiconductive material.

A lateral edge of the cathode region may form a longitudinal p-n junction with an adjacent region. The adjacent region may be the anode contact region. In other embodiments, the diode may include a breakdown voltage boost region positioned between the anode contact region and the lateral edge of the cathode region. In these embodiments, the doping of the breakdown voltage boost region may be controlled to be less than the doing in the anode contact region and possibly less than the doping in the anode region itself such that reverse bias breakdown current occurs preferentially via the latitudinal Zener junction, i.e., a breakdown voltage of the latitudinal Zener junction is lower in magnitude than the breakdown voltage of the longitudinal p-n junction.

In another aspect, a disclosed semiconductor fabrication process includes forming a shallow anode region within a Zener junction region of a well region of a semiconductor substrate and forming a cathode region underlying the anode region. The depths and doping concentrations of the anode and cathode regions are controlled to produce a shallow subsurface latitudinal Zener junction.

An anode contact region extending from the substrate upper surface to a third depth may be formed where the anode contact region has a third doping concentration. The anode contact region may provide an electrically conductive interconnect to an anode contact located exterior to the Zener junction region so that the Zener junction region need not have a depth or doping concentration sufficient to support an Ohmic contact. A cathode contact region that provides an Ohmic contact to the well region may also be formed to enable biasing of the well as well as the cathode.

The cathode contact region may be in the form of a cathode contact ring surrounding the anode contact region and disclosed methods may include forming an isolation ring providing electrical isolation between the anode contact region and the cathode contact region. The isolation ring might be implemented as a shallow trench isolation structure, a silicide blocking structure, a local oxidation of silicon (LOCOS) structure, or another suitable isolation structure. The process may include forming a silicide blocking structure that protects the shallow Zener junction from silicide processing.

In some implementations, a breakdown voltage boost region may be fabricated and positioned between a lateral edge of the cathode region and the anode contact region. In these embodiments, the breakdown voltage of the longitudinal p-n junction may be greater than the breakdown voltage of the latitudinal Zener junction.

The fabrication process may include logic process steps for forming MOS transistors. In these embodiments, the logic process steps may include, as examples, a lightly doped drain extension implant for PMOS transistors, a halo implant for PMOS transistors, a p+ source/drain implant, and an n+ source/drain implant. To minimize the amount of additional processing required to implement the disclosed Zener diodes within the logic process, the Zener diode anode region may formed with the extension implant, the Zener diode cathode region may be formed with the halo implant, the Zener diode anode contact region may be formed with the p+ source/drain implant, and the Zener diode cathode contact region may be formed with the n+ source/drain implant.

In still another aspect, a disclosed Zener diode includes an anode region and a cathode region that form a shallow subsurface latitudinal Zener junction. The Zener diode may further include an anode contact region interconnecting the anode region with a contact located away from the Zener junction region and a silicide blocking structure overlying the anode region. The Zener diode may also include one or more shallow, sub-surface longitudinal p-n junctions at the junctions between lateral edges of the cathode region and the adjacent region. The adjacent region may be a heavily doped region such as the anode contact region. In other embodiments, the Zener diode may include a breakdown voltage boost region comprising a more lightly doped region located between the cathode region and the anode contact region.

Turning now to the drawings, FIG. 1 depicts selected elements of a diode 100 according to a first embodiment. Diode 100 is a semiconductor diode that operates as a Zener diode. The p-n junction in traditional semiconductor diodes generally includes a lightly doped region that dictates the width of the reverse bias depletion region. As suggested above, Zener diodes may achieve lower breakdown voltage by creating a depletion region that is sufficiently thin to produce an electric field having a magnitude that induces breakdown at modest reverse bias voltages.

FIG. 1 depicts a cross section of a semiconductor wafer 101 at a selected stage in the fabrication of Zener diode 100. Although FIG. 1 depicts just a single diode 100, it will be appreciated that semiconductor wafer 101 may have a plurality of such diodes and may, in addition, include transistors and other non-diode elements (not shown), which may be collectively or generically referred to herein as "logic." Regions of semiconductor wafer 101 that have an extrinsic concentration of holes are indicated with a p-type designation while regions of semiconductor wafer 101 having an extrinsic concentration of electrons are indicated with an n-type designation. These designations are indicated for purposes of clarity in describing the structure and function of diode 100, but other embodiments may employ oppositely doped regions.

In the embodiment depicted in FIG. 1, diode 100 is formed in an n-type well (n-well) 104 of a semiconductor wafer 101. The n-well 104 lies within a p-substrate 102 of semiconductor 101, as do p-type wells (p-wells) 106. Semiconductor wafer 101 may include a bulk portion (not depicted) that includes or underlies p-type substrate (p-substrate) 102. The bulk portion of semiconductor wafer 101 may include, as examples, one or more epitaxial layers, one or more extrinsically doped n-type or p-type regions, and one or more electrically insulating layers such as a buried silicon dioxide layer (not depicted). The p-substrate 102 itself may be an epitaxial layer formed over a p-type or n-type bulk (not depicted).

Although the depths and impurity concentrations of n-well 104 and p-well 106 are implementation details that may vary from one embodiment to another, some embodiments of diode 100 include an n-well 104 having a depth of approximately 1.0 to 2.5 µm and a doping concentration in the range of approximately 2E15 to 5E18 $cm^{-3}$. Similarly, p-well 106 may have a depth in the range of approximately 1.0 to 2.5 µm and an impurity concentration in the range of approximately 2E15 to 5E18 $cm^{-3}$. The dopant employed in n-well 104 may be phosphorous, arsenic, antimony, or a combination thereof while the dopant in p-well 106 may be boron, indium, or a combination thereof. The depths indicated represent the final depths of the respective well regions. If the well regions are formed using ion implantation, the implant dose and energy may be determined to achieve the final desired depth and the as-implanted depth may be less than the final depth to account for re-distribution of the implant during any post-implant annealing or other processing. The sequence in which n-well 104 and p-well 106 are formed is not determinative and either sequence may be employed. Moreover, although FIG. 1 depicts a p-type substrate 102 and a p-well 106, other embodiments may omit a p-well and leverage the doping concentration and doping type of p-substrate 102 as a de facto well.

FIG. 1 further depicts shallow trench isolation (STI) structures 110 formed in an upper portion of substrate 101 extending downward from an upper surface 103 of semiconductor wafer 101. A depth of STI structures 110 is an implementation detail, but may be sufficiently deep to provide physical and electrical isolation between any pair of neighboring extrinsically doped regions including, in the depicted embodiment, n-type cathode contact regions 140 and p-type anode contact regions 150. Thus, in some embodiments, a depth of STI structures 110 may be in the range of approximately 0.25 μm to 1.0 μm. Shallow trench isolation structures 110 may include a deposited silicon dioxide material, e.g., tetraethylorthosilicate (TEOS)-based silicon dioxide, or another suitable, electrically insulating material.

In the embodiment depicted in FIG. 1, STI structures 110-1 and 110-2 form a first ring surrounding diode 100 and separating p-type anode contact regions 150 from n-type cathode contact regions 140. In addition, STI structures 110-3 and 110-4 as illustrated in the depicted embodiment provide a ring of isolation between n-type cathode contact regions 140 and p-type substrate contact regions 160.

Other implementations (not depicted) may omit STI structures 110 and employ, instead, silicide blocking structures to isolate n-type cathode contact regions 140 and p-type anode contact regions 150. In these implementations, a silicide blocking structure may be formed overlying regions of wafer 101 lying between p-type anode contact regions 150 and n-type cathode contact regions 140. As suggested by its name, a silicide blocking structure is a structure formed overlying silicon that prevents the underlying silicon from reacting with a subsequently deposited material such as tungsten, titanium, cobalt, nickel, tantalum, platinum or other suitable material to form a silicide. A silicide blocking structure itself may be silicon dioxide, silicon nitride, or another type of electrical insulator. If a silicide blocking structure is used to prevent electrical coupling of n-type cathode contact regions 140 and p-type anode contact regions 150, the silicide blocking structure may overlap n-type cathode contact region 140 and/or p-type anode contact region 150 to some extent, but the doping concentration of the majority of the silicon underlying the silicide blocking structure, should be sufficiently low to insure adequate isolation, e.g., less than approximately $1E18$ $cm^{-3}$.

After the formation of n-well 104 and p-well 106, an n-type cathode region 120 and a p-type anode region 130 may be formed in a Zener junction region 125 within n-well 104 of p-substrate 102. The order in which n-type cathode region 120 and p-type anode region 130 are formed is an implementation detail and either may be formed first. Because n-type cathode region 120 and p-type anode region 130 are positioned above and below one another, a single mask may be used for implants that form anode region 130 cathode region 120.

In some implementations, n-type cathode region 120 may be located, when fabrication of diode 100 is complete, adjacent to two or more different p-type regions to form multiple shallow, sub-surface p-n junctions. For example, in the implementation depicted in FIG. 1, n-type cathode region 120 forms a shallow, sub-surface latitudinal Zener junction 126 with p-type anode region 130 and one or more shallow, sub-surface longitudinal p-n junctions 128 with p-type contact regions 150. As used herein, latitudinal refers to an orientation parallel to an upper surface 103 of semiconductor wafer 101. In some embodiments, n-type cathode region 120 may be formed with an arsenic, phosphorus, or antimony implant to produce an impurity concentration in the range of approximately $5E17$ to $5E18$ $cm^{-3}$ and extending to a depth in the range of approximately 0.1 to 0.3 μm below latitudinal Zener junction 126. In some embodiments, p-type anode region 130 extends from upper surface 103 to a depth in the range of approximately 0.1 to 0.3 μm and may have a doping concentration in the range of approximately $5E17$ to $5E18$ $cm^{-3}$. In these embodiments, the depth of latitudinal Zener junction 126 is in the range of approximately 0.1 to 0.3 μm.

Either before or after p-type anode contact region 150 has been formed, a silicide blocking structure 135 may be formed on upper surface 103 of semiconductor wafer 101 overlying Zener junction region 125 of substrate 101. As suggested by its name, silicide blocking structure 135 may be fabricated with a material and thickness sufficient to prevent a subsequently performed silicide process from forming a silicide with silicon underlying the silicide blocking structure. In some embodiments, silicide blocking structure 135 may be an electrically insulating structure such as a deposited silicon dioxide structure. In other embodiments, silicide blocking structure 135 may include polysilicon or another electrically conductive or semiconductive material. In these embodiments, silicide blocking structure 135 may assist in maintaining electrical continuity between p-type anode contact region 150 and p-type anode region 130.

A thickness of silicide blocking structure 135 may be in the range of approximately 20 to 2000 nm. In some embodiments, silicide blocking structure 135 may be a sacrificial structure that is removed when fabrication of diode 100 is complete or substantially complete. In other embodiments, silicide blocking structure 135 may be a permanent structure that remains as a part of diode 100. When implemented in conjunction with fabrication processes that include a silicide block, silicide blocking structure 135 may be formed without addition of a masking step to the process.

In some embodiments, p-type anode contact regions 150 and n-type cathode contact regions 140 may be formed during p+ and n+ source/drain implants and silicide blocking structure 135 may be either present or absent. In some embodiments, the silicon dioxide or other material used to form sidewall spacers on logic transistors is leveraged for use as the material for silicide blocking structures 135 and, in these embodiments, silicon blocking structure 135 is present when p-type anode contact region 150 is formed. A silicide block masking step is performed before spacer etch and p-type anode contact region 150 is largely self-aligned to silicide blocking structure 135, taking into account some overlap due to diffusion and migration of the implanted species. In other embodiments, silicide blocking structure 135 is formed after p+ source/drain implant. In these embodiments, a dedicated deposition and masking sequence is used after p+ source/drain implant to form silicide blocking structure 135. In these embodiments, the material and thickness of silicide blocking structure 135 as well as the amount of overlap between silicide block structure 135 and Zener junction region 125 are independently controllable.

Although the depth and doping concentration of p-type anode contact regions 150 are an implementation detail, p-type anode contact regions 150 may be heavily doped or p+ regions having an impurity concentration exceeding approximately $1E20$ $cm^{-3}$ and a depth of approximately 0.15 to 0.35 μm. FIG. 1 depicts p-type anode contact regions 150 and n-type cathode region 120 having equal or approximately equal depths. More generally, however, the depth of p-type anode contact regions 150 may be greater or lesser than the depth of n-type cathode region 120. In some embodiments, the depth of p-type anode contact region 150 may be defined such that it is greater than the depth of p-type anode region 130 by an amount sufficient to form an operationally stable p-n junction with n-type cathode region 120.

In addition to p-type anode contact regions 150, diode 100 as depicted in FIG. 1 includes an n-type cathode contact region 140. The sequence in which p-type anode contact regions 150 and n-type cathode contact regions 140 are formed is an implementation detail and n-type cathode contact regions 140 may be formed before or after p-type anode contact regions 150. Although the depth and doping concentration of n-type cathode contact regions 140 are an implementation detail, some embodiments of diode 100 include n-type cathode contact regions 140 having an impurity concentration in the range of approximately 1E20 to 1E21 cm$^{-3}$ and a depth of approximately 0.15 to 0.35 µm. In embodiments not depicted, regions 140, 104, and 120 are p-type regions and regions 130 and 150 are n-type. In these embodiments, it will be understood that the terms "anode" and "cathode" may be reversed in recognition of the convention of identifying the p-type terminal of a diode as the anode and the n-type terminal as the cathode.

From a functional perspective, n-type cathode contact regions 140 provide an Ohmic contact to cathode region 120, via n-well 104, to function as a cathode terminal for diode 100. Similarly, p-type contact regions 150 provide an anode terminal for diode 100 by providing an Ohmic contact to p-type anode region 130, which serves as the diode's anode.

It should be noted that the concentrations and depth ranges of the various regions of diode 100 as depicted in FIG. 1 are range estimates that may vary substantially from implementation to implementation. For example, a change of fabrication technology may result in different impurity concentrations and junction depths. In some cases, more advanced fabrication process technologies that include smaller features sizes may have higher doses and/or higher impurity concentrations, and shallower depths than older fabrication technologies, but newer technologies may also have lower doses and/or deeper depths. Similarly, although diode 100 as depicted in FIG. 1 may be fabricated by a sequence of ion implantation steps performed in the following order: n-well implant, p-well implant, n-type cathode implant, anode implant, n+ implant, and p+ implant, other embodiments may employ different sequences.

Figure 2:
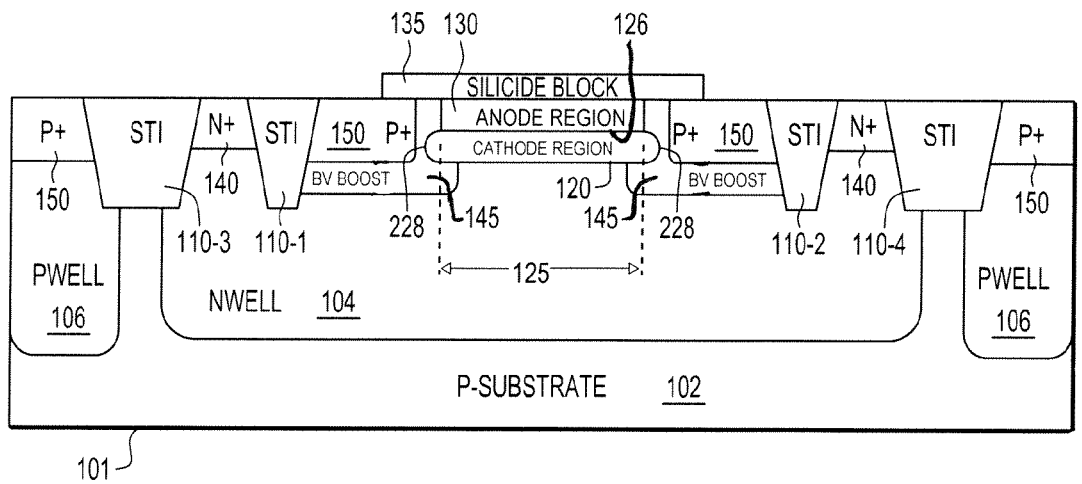
FIG. 2 is a cross section depicting selected elements of a second embodiment of a Zener diode.

Turning now to FIG. 2, a second embodiment of Zener diode 100 is depicted. Zener diode 100 as depicted in FIG. 2 includes a significant number of elements that are equivalent, or substantially equivalent to elements of Zener diode 100 as depicted in FIG. 1. Zener diode 100 of FIG. 2, however, includes an additional p-type region referred to herein as breakdown voltage boost (BV boost) region 145. As depicted in FIG. 2, BV boost region 145 replaces the longitudinal p-n junction 128 of FIG. 1 with the longitudinal p-n junction 228 of FIG. 2.

The design of p-type anode region 130, n-type cathode region 120, and p-type anode contact regions 150 may be chosen to conduct forward and/or reverse bias current through one of the p-n junctions preferentially and reverse breakdown current preferentially through a different p-n junction. For example, diode 100 as depicted in FIG. 2 may conduct forward bias current primarily through longitudinal Zener junctions 228 while conducting reverse breakdown current primarily through latitudinal junction 126 or vice versa.

In some embodiments, BV boost region 145 is formed prior to the formation of silicide blocking structure 135 and the implant that forms BV boost region 145 is an implant that already exists, for another purpose, in a fabrication process for CMOS logic. For example, many fabrication processes include a shallow, lightly doped, extension implant for transistors in the device's core and an analogous implant for peripheral or I/O transistors. In these embodiments, one of the extension implants may be leveraged to serve as the BV boost implant as well. In other words, one of the extension implants may also serve as the BV boost implant. In these embodiments, the BV boost implant may be performed before the silicide blocking structure 135 is formed.

The BV boost region 145 is also shown in FIG. 2 as having a greater depth than p-type anode contact regions 150. Although the specifics of BV boost region 145 are an implementation detail, some embodiments of BV boost region 145 have an impurity concentration in the range of approximately 5E17 to 1E19 cm$^{-3}$ and a depth of approximately 0.15 through 0.5 µm.

As depicted in FIG. 2, the introduction of BV boost region 145 alters the p-n junction structure of diode 100. Whereas n-type cathode region 120 forms a longitudinal p-n junction 128 with p-type anode contact region 150 in the embodiment of FIG. 1, n-type cathode region 120 forms a longitudinal p-n junction 228 with BV boost region 145 in the embodiment of FIG. 2. It will be appreciated that, because the impurity concentration of BV boost region 145 is significantly lower than the impurity concentration of p-type anode contact regions 150, the reverse breakdown voltage of p-n junction 228 is higher than the reverse breakdown voltage of p-n junction 128 in FIG. 1. Thus, the inclusion of BV boost region 145 may result in reverse breakdown occurring preferentially at latitudinal p-n-junction 126. Alternatively, BV boost region 145 may be implemented with an implant that results in BV boost region 145 having a higher impurity concentration than anode region 130. In these embodiments, reverse breakdown may occur preferentially at longitudinal p-n junction 228.

Figure 3:
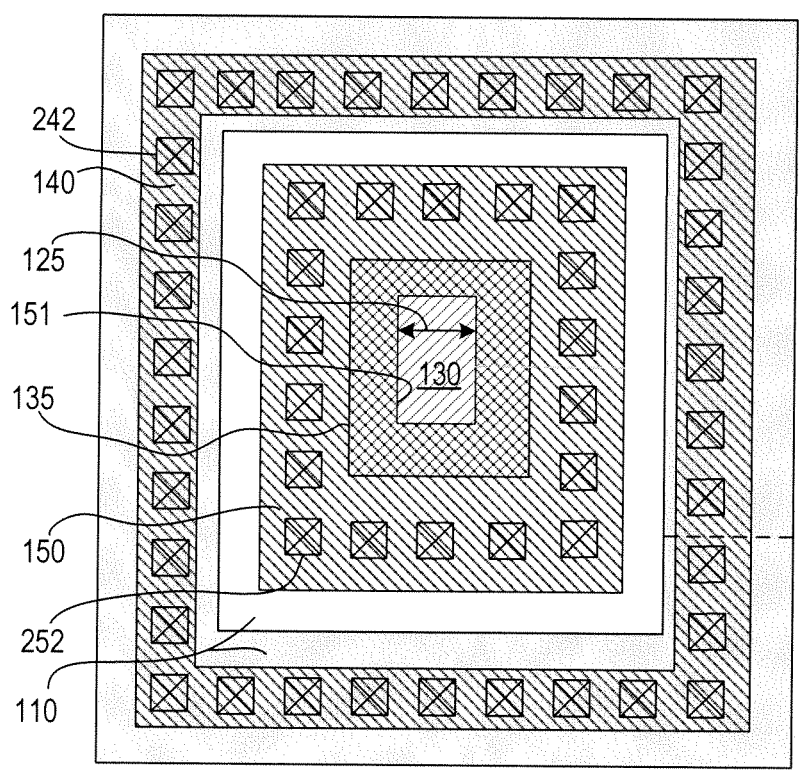
FIG. 3 is a top view of features of an embodiment of the Zener diodes of FIG. 1.

Referring now to FIG. 3, selected elements of Zener diode 100 are depicted in top view. As depicted in FIG. 3, the substantially rectangular silicide blocking structure 135 overlaps Zener junction region 125, which is defined by an interior ring 151 of the ring shaped anode contact region contact region 150. Cathode contacts 242 are shown relative to n-type cathode contact region 140 while anode contacts 252 are shown within anode contact region 150.

As depicted in FIG. 3, anode contacts 252 are located exterior to Zener junction region 125 to accommodate implementations in which the depth and concentration of anode region 130 within Zener junction region 125 may be insufficient to accommodate an Ohmic contact. Instead anode contacts 252 provide contact to p-type anode contact region 150, which may be a heavily doped p+ region that provides highly conductive coupling to anode region 130. FIG. 3 further depicts shallow trench isolation element 110 as a ring shaped structure disposed between n-type cathode contact region 140 and p-type anode contact region 150, which are both ring-shaped as well.

Although the embodiment of Zener diode 100 depicted in FIG. 3 is substantially rectangular, other implementations may employee differently shaped regions including, as examples, oval structures, circular structures, and parallelogram structures having more than four sides. Moreover, although many implementations described above with respect to FIG. 1, FIG. 2, and FIG. 3 indicate certain regions as being p-type or n-type, it will be appreciated by those of skill in the field of semiconductor fabrication that other embodiments may employ oppositely doped type regions. Thus, for example, whereas Zener diode 100 as depicted in FIG. 1 includes an n-type well region 104 in which Zener junction region 125 is located, other embodiments may employee a p-type well region 104 in which Zener junction region 125 is located. In these embodiments, the regions depicted in FIG. 1 as being n-type would be p-type and vise versa.

Although disclosed subject matter is described herein with reference to specific embodiments, various modifications and changes can be made without departing from the scope of the subject matter as set forth in the claims below. For example, although the embodiments depicted and described herein have the anode positioned at the wafer surface and overlying the cathode, the cathode might be positioned overlying the anode. In such cases, if the starting material has a p-type substrate, isolation of the anode from the substrate is likely needed and can be implemented with a deep n-well, an n-type buried layer (NBL), or a buried dielectric layer, e.g., a buried oxide in a silicon on insulator.

Accordingly, the specification and figures are to be regarded as illustrative rather than restrictive and the modifications and changes referred to are intended to be included within the scope of the present invention. Unless expressly stated otherwise, any benefits, advantages, or solutions to problems that are described herein with regard to specific embodiments are not intended to be construed as critical, required, or essential features or elements of any or all the claims. Similarly, unless expressly stated otherwise, terms such as "first" and "second" may be used solely to distinguish between different elements such terms describe. Thus, these terms are not necessarily intended to indicate temporal or other prioritization of such elements.

What is claimed is:

1. A diode, comprising:
    an anode region extending from an upper surface of a substrate to a first depth, the anode region having a first conductivity type and a first doping concentration;
    a cathode region of a second conductivity type underlying the anode region and extending to a second depth and having a second doping concentration, wherein the anode region and the cathode region form a sub-surface, latitudinal Zener junction;
    an anode contact region of the first conductivity type adjacent to the anode region and extending from the upper surface to a third depth and having a third doping concentration, wherein the third doping concentration is greater than the first doping concentration and a lateral edge of the cathode region forms a longitudinal p-n junction with the anode contact region; and
    a cathode contact region of the second conductivity type extending from the upper surface to a fourth depth and having a fourth doping concentration, wherein the fourth doping concentration is greater than the second doping concentration and the cathode contact region is in electrical continuity with the cathode region.

2. The diode of claim 1, further comprising a well region of the second conductivity type underlying the cathode region, the cathode contact region, and the anode contact region, the well region having a fifth doping concentration and a fifth depth, wherein the cathode contact region provides an Ohmic contact to the well region.

3. The diode of claim 2, further wherein the cathode contact region is in electrical continuity with the well region and the well region is in electrical continuity with the cathode region.

4. The diode of claim 1, wherein a depth of the latitudinal p-n junction is in the range of approximately 50 to 250 nm.

5. The diode of claim 1, further comprising a silicide blocking structure overlying the anode region.

6. The diode of claim 5, wherein a material of the silicide blocking structure is selected from silicon dioxide, silicon nitride, and silicon oxygen nitrogen compounds.

7. A diode, comprising:
    an anode region extending from an upper surface of a substrate to a first depth, the anode region having a first conductivity type and a first doping concentration;
    a cathode region of a second conductivity type underlying the anode region and extending to a second depth and having a second doping concentration, wherein the anode region and the cathode region form a sub-surface, latitudinal Zener junction;
    an anode contact region of the first conductivity type adjacent to the anode region and extending from the upper surface to a third depth and having a third doping concentration, wherein the third doping concentration is greater than the first doping concentration; and
    a cathode contact region of the second conductivity type extending from the upper surface to a fourth depth and having a fourth doping concentration, wherein the fourth doping concentration is greater than the second doping concentration and the cathode contact region is in electrical continuity with the cathode region, wherein a lateral edge of the cathode region forms a longitudinal p-n junction with a breakdown voltage boost region of the first conductivity type positioned between the anode contact region and the lateral edge of the cathode region, the breakdown voltage boost region having a sixth doping concentration and a sixth depth, wherein the sixth doping concentration is less than the third doping concentration.

8. The diode of claim 7, wherein the sixth doping concentration is lower than the first doping concentration and wherein a breakdown voltage of the latitudinal Zener junction has a magnitude that is lower than a magnitude of the breakdown voltage of the longitudinal p-n junction.

9. The diode of claim 7, wherein the sixth doping concentration is greater than the first doping concentration and wherein a breakdown voltage of the latitudinal Zener junction has a magnitude that is greater than a magnitude of the breakdown voltage of the longitudinal p-n junction.

10. A semiconductor fabrication process, comprising:
    forming an anode region within a Zener junction region of a well region of a semiconductor substrate, the anode region extending from an upper surface of a substrate to a first depth, the anode region having a first conductivity type and a first doping concentration and the well region having a second conductivity type, opposite the first conductivity type;
    forming, in the Zener junction region, a cathode region of the second conductivity type underlying the anode region and extending to a second depth and having a second doping concentration, wherein the first region and the second region form a latitudinal Zener junction;
    forming an anode contact region of the first conductivity type extending from the upper surface to a third depth and having a third doping concentration, wherein the third doping concentration is greater than the first doping concentration and wherein the anode contact region provides an electrically conductive interconnect to an anode contact located exterior to the Zener junction region; and
    forming a cathode contact region of the second conductivity type extending from the upper surface to a fourth depth and having a fourth doping concentration, wherein the cathode contact region provides an Ohmic contact to the well region and the cathode contact region comprises a cathode contact ring surrounding the anode contact region, wherein the well region has a fifth depth and a fifth doping concentration; and
    forming an isolation ring providing electrical isolation between the anode contact region and the cathode contact region.

11. The fabrication process of claim 10, wherein forming the isolation ring includes forming a ring of an isolation structure selected from a shallow trench isolation structure, a silicide blocking structure, and a local oxidation of silicon isolation structure.

12. The fabrication process of claim 10, further comprising forming a junction protection silicide blocking structure overlying the Zener junction region.

13. The fabrication process of claim 10, further comprising forming a breakdown voltage boost region of the first conductivity type positioned between a lateral edge of the cathode region and the anode contact region, the breakdown voltage boost region having a sixth doping concentration, wherein the sixth doping concentration is less than the third doping concentration and further wherein the sixth doping concentration is less than the first doping concentration and a magnitude of a breakdown voltage of the longitudinal p-n junction is greater than a magnitude of a breakdown voltage of the latitudinal Zener junction.

14. The fabrication process of claim 10, further comprising forming a breakdown voltage boost region of the first conductivity type positioned between a lateral edge of the cathode region and the anode contact region, the breakdown voltage boost region having a sixth doping concentration, wherein the sixth doping concentration is less than the third doping concentration and further wherein the sixth doping concentration is greater than the first doping concentration and a magnitude of a breakdown voltage of the longitudinal p-n junction is less than a magnitude of a breakdown voltage of the latitudinal Zener junction.

15. The fabrication process of claim 10, wherein: the fabrication process includes logic process steps for forming MOS transistors, the logic process steps including a p+ source/drain implant, an n+ source/drain implant, and a lightly doped drain extension implant and a halo implant for at least one of PMOS transistors and NMOS transistors; and the anode region is formed with the extension implant, the cathode region is formed with the halo implant, the anode contact region is formed with the p+ source/drain implant, and the cathode contact region is formed with the n+ source/drain implant.

16. A semiconductor device, comprising:
an anode region of a first conductivity type within a Zener junction region of a well region of a semiconductor substrate, the well region of a second conductivity type, the anode region extending from an upper surface of a substrate to a first depth;
a cathode region of a second conductivity type in the well region, the cathode region underlying the anode region and extending to a second depth, wherein a junction between cathode region and the anode region comprises a shallow sub-surface latitudinal Zener junction;
an anode contact region of the first conductivity type interconnecting the anode region with a contact located exterior to the Zener junction region;
a well contact region of the second conductivity type providing an Ohmic contact to the well region; and
a breakdown voltage boost region of the first conductivity type, laterally positioned between a lateral edge of the cathode region and the anode contact region, the breakdown voltage boost region forming a longitudinal p-n junction with the lateral end of the cathode region.

17. The device of claim 16, further comprising a silicide blocking structure overlying the Zener junction region and preventing silicide formation of the Zener junction region.

* * * * *